United States Patent
Sugiya

(10) Patent No.: US 10,937,697 B2
(45) Date of Patent: Mar. 2, 2021

(54) METHOD OF PROCESSING A SEMICONDUCTOR WAFER THAT INVOLVES CUTTING TO FORM GROOVES ALONG THE DICING LINES AND GRINDING REVERSE SIDE OF THE WAFER

(71) Applicant: DISCO CORPORATION, Tokyo (JP)

(72) Inventor: Tetsukazu Sugiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/426,108

(22) Filed: May 30, 2019

(65) Prior Publication Data

US 2019/0378759 A1    Dec. 12, 2019

(30) Foreign Application Priority Data

Jun. 6, 2018   (JP) .............................. JP2018-108688

(51) Int. Cl.
| | |
|---|---|
| *H01L 21/78* | (2006.01) |
| *H01L 21/67* | (2006.01) |
| *G01N 21/95* | (2006.01) |
| *H01L 21/66* | (2006.01) |

(52) U.S. Cl.
CPC ......... *H01L 21/78* (2013.01); *G01N 21/9501* (2013.01); *H01L 21/67288* (2013.01); *H01L 22/12* (2013.01)

(58) Field of Classification Search
CPC ....... H01L 21/78; H01L 21/82; H01L 21/822; H01L 22/12; H01L 21/67288; H01L 21/302; H01L 21/304; H01L 21/3043; H01L 21/6836; H01L 2221/68327; H01L 2221/6834; G01N 21/9501

See application file for complete search history.

(56) References Cited

U.S. PATENT DOCUMENTS

| | | | |
|---|---|---|---|
| 9,616,544 B2 * | 4/2017 | Ito | G06T 7/0004 |
| 2006/0130967 A1 * | 6/2006 | Fujisawa | H01L 21/67092 |
| | | | 156/345.1 |

FOREIGN PATENT DOCUMENTS

| | | | |
|---|---|---|---|
| JP | 2003007653 A | * | 1/2003 |
| JP | 2008004806 A | | 1/2008 |

* cited by examiner

*Primary Examiner* — Ermias T Woldegeorgis
(74) *Attorney, Agent, or Firm* — Greer, Burns & Crain, Ltd.

(57) ABSTRACT

A method of processing a wafer includes a cutting step of cutting the face side of the wafer with a cutting blade to form grooves therein along projected dicing lines, a first inspecting step of capturing an image of the grooves formed in the cutting step and inspecting a state of a chip in the captured image of the grooves, a protecting member sticking step of sticking a protective member to the face side of the wafer, a grinding step of holding the protective member side of the wafer on a chuck table and grinding a reverse side of the wafer to thin the wafer to a finished thickness, thereby dividing the wafer into device chips, a second inspecting step of capturing an image of the grooves exposed on the reverse side of the wafer and inspecting a state of a chip in the captured image of the grooves.

10 Claims, 12 Drawing Sheets

METHOD OF PROCESSING A SEMICONDUCTOR WAFER THAT INVOLVES CUTTING TO FORM GROOVES ALONG THE DICING LINES AND GRINDING REVERSE SIDE OF THE WAFER

BACKGROUND OF THE INVENTION

Field of the Invention

The present invention relates to a method of processing a wafer and a grinding apparatus.

Description of the Related Art

As device chips for use in various electronic appliances are becoming lighter, thinner, and smaller, advanced grinding, polishing, and cutting technologies are required to manufacture them from wafers. Particularly, in a dicing step to divide a wafer into device chips (see, for example, Japanese Patent No. 5134216), since a wafer is mechanically cut along projected dicing lines thereon by a cutting blade, the opposite edge portions of each cut groove may be broken by the cutting blade, leaving dents therein. The sizes of those flaws are controlled according to processing conditions that are chosen to prevent the devices on the device chips from being fragmented.

SUMMARY OF THE INVENTION

However, the dicing step disclosed in Japanese Patent No. 5134216 tends to abruptly produce large chips (dents, cracks), also referred to as chips, for some reasons, possibly damaging devices to be fabricated from the wafer. The damaged devices can be detected in a process of inspecting electric characteristics thereof. If all the devices fabricated from the wafer are not inspected, but some of them are randomly inspected, then it is difficult to detect all the damaged devices, and some of them may not be rejected as defective products. One solution would be to capture an image of cut grooves with a camera used for wafer alignment on the cutting apparatus, so that chipping of the edge portions of the cut grooves can be detected from the captured image. However, though the camera used for wafer alignment on the cutting apparatus is able to observe chips on the face side of the wafer, it is unable to inspect the reverse side of the wafer.

It is therefore an object of the present invention to provide a method of processing a wafer and a grinding apparatus which are capable of inspecting the reverse sides of device chips cut from a wafer.

In accordance with an aspect of the present invention, there is provided a method of processing a wafer having a plurality of projected dicing lines on a face side thereof and a plurality of devices formed in respective areas of the face side that are demarcated by the projected dicing lines, including a cutting step of cutting the face side of the wafer with a cutting blade to form grooves therein along the projected dicing lines to a depth in excess of a finished thickness of the wafer, a first inspecting step of capturing an image of the grooves formed in the cutting step from the face side of the wafer and inspecting a state of a chip in the captured image of the grooves, after the first inspecting step, a protecting member sticking step of sticking a protective member to the face side of the wafer, a grinding step of holding the protective member side of the wafer on a chuck table and grinding a reverse side of the wafer to thin the wafer to a finished thickness, thereby dividing the wafer into device chips, and after the grinding step, a second inspecting step of capturing an image of the grooves exposed on the reverse side of the wafer from the reverse side of the wafer and inspecting a state of a chip in the captured image of the grooves.

In the above method of processing a wafer, each of the first inspecting step and the second inspecting step may include the steps of acquiring positional information of the grooves in the wafer whose image has been captured and acquiring positional information of the inspected chip.

In accordance with another aspect of the present invention, there is provided a grinding apparatus including a chuck table for holding a wafer on a holding surface thereof, a grinding unit grinding the wafer held on the chuck table with grinding stones mounted on a spindle having a rotational axis perpendicular to the holding surface of the chuck table, and an inspecting unit having a camera for capturing an image of grooves defined in the wafer which are exposed on a reverse side of the wafer when the water held on the chuck table is ground by the grinding unit, in which the inspecting unit inspects a state of a chip in the grooves from the image captured by the camera and acquires the result of inspection of the grooves together with positional information of the grooves in the wafer.

The present invention is advantageous in that it can inspect the reverse sides of the device chips divided from the wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments according to the present invention will be described in detail below with reference to the drawings. The present invention is not limited to the details of the embodiments described below. The components described below cover those which could easily be envisaged by those skilled in the art and those which are essentially identical to those described above. Furthermore, the arrangements described below can be used in appropriate combinations. Various omissions, replacements, or changes of the arrangements may be made without departing from the scope of the present invention.

Embodiment 1

Figure 1:
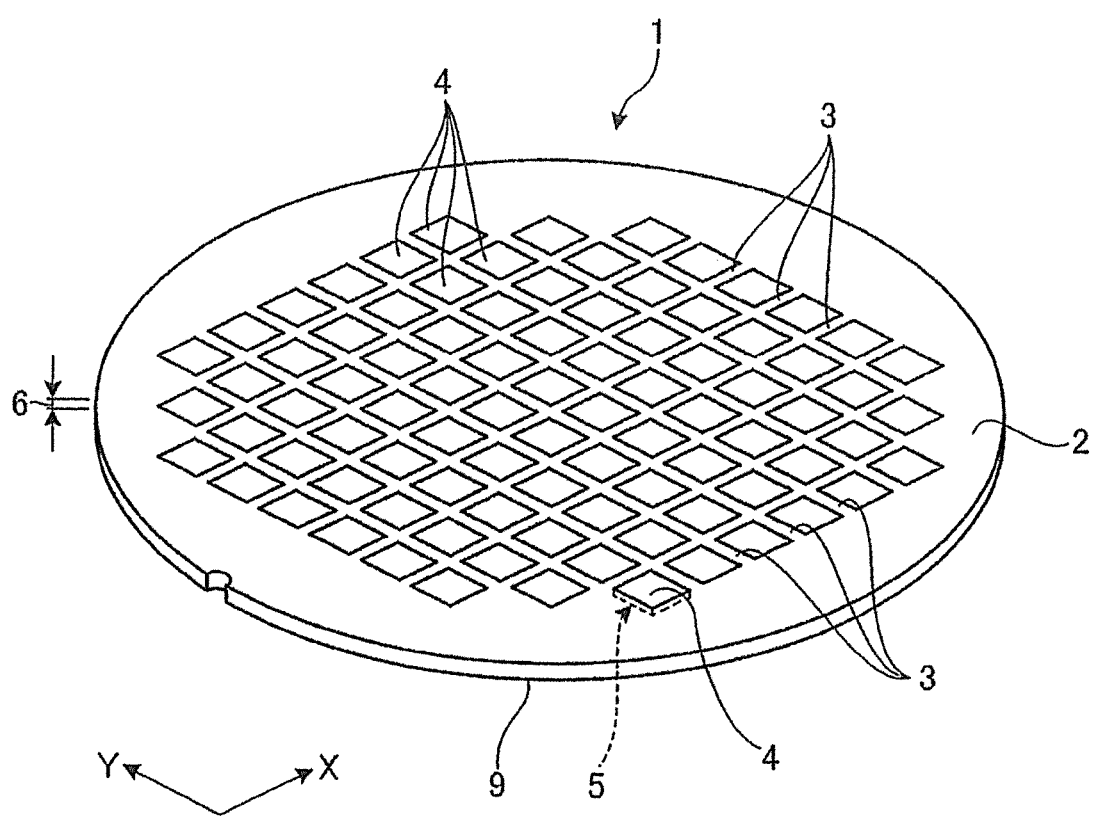
FIG. 1 is a perspective view of a wafer to be processed by a method of processing a wafer according to Embodiment 1.
Figure 2:
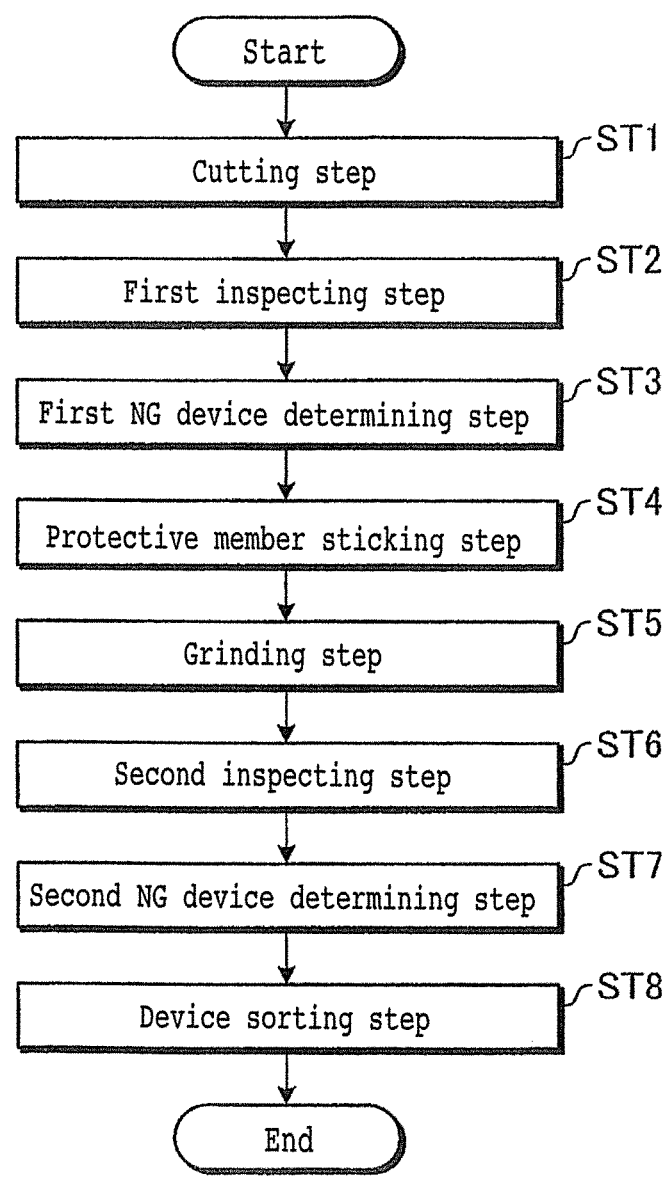
FIG. 2 is a flowchart of the method of processing a wafer according to Embodiment 1.

A method of processing a wafer according to Embodiment 1 of the present invention will be described below with reference to the drawings. FIG. 1 is a perspective view of a wafer to be processed by a method of processing a wafer according to Embodiment 1. FIG. 2 is a flowchart of the method of processing a wafer according to Embodiment 1.

The method of processing a wafer, also referred to as "wafer processing method," according to Embodiment 1 applies as a method of processing a wafer 1 illustrated in FIG. 1. According to Embodiment 1, the wafer 1, i.e., a workpiece to be processed by the wafer processing method, may be a disk-shaped semiconductor wafer or optical device wafer made of silicon, sapphire, gallium, or the like as a base material. The wafer 1 has a grid of projected dicing lines 3 on a face side 2 thereof and a plurality of devices 4 formed in respective areas demarcated on the face side 2 by the projected dicing lines 3. According to Embodiment 1, the projected dicing lines 3 include a first group of projected dicing lines 3 and a second group of projected dicing lines 3 that extend perpendicularly to the first group of projected dicing lines 3. According to Embodiment 1, every location or position on the wafer 1 is specified by a distance that it is spaced from a predetermined reference position in an X-axis direction, i.e., a direction parallel to the projected dicing lines 3 in the first or second group, and a distance that it is spaced from the predetermined reference position in a Y-axis direction, i.e., a direction parallel to the projected dicing lines 3 in the second or first group.

The wafer processing method according to Embodiment 1 applies as a method of dividing the wafer 1 illustrated in FIG. 1 into individual device chips 5. Each of the device chips 5 includes one of the devices 4 and part of the base material of the wafer 1. As illustrated in FIG. 2, furthermore, the wafer processing method according to Embodiment 1 includes a cutting step ST1, a first inspecting step ST2, a first NG device determining step ST3, a protecting member sticking step ST4, a grinding step ST5, a second inspecting step ST6, a second NG device determining step ST7, and a device sorting step ST8.

(Cutting Step)

Figure 3:
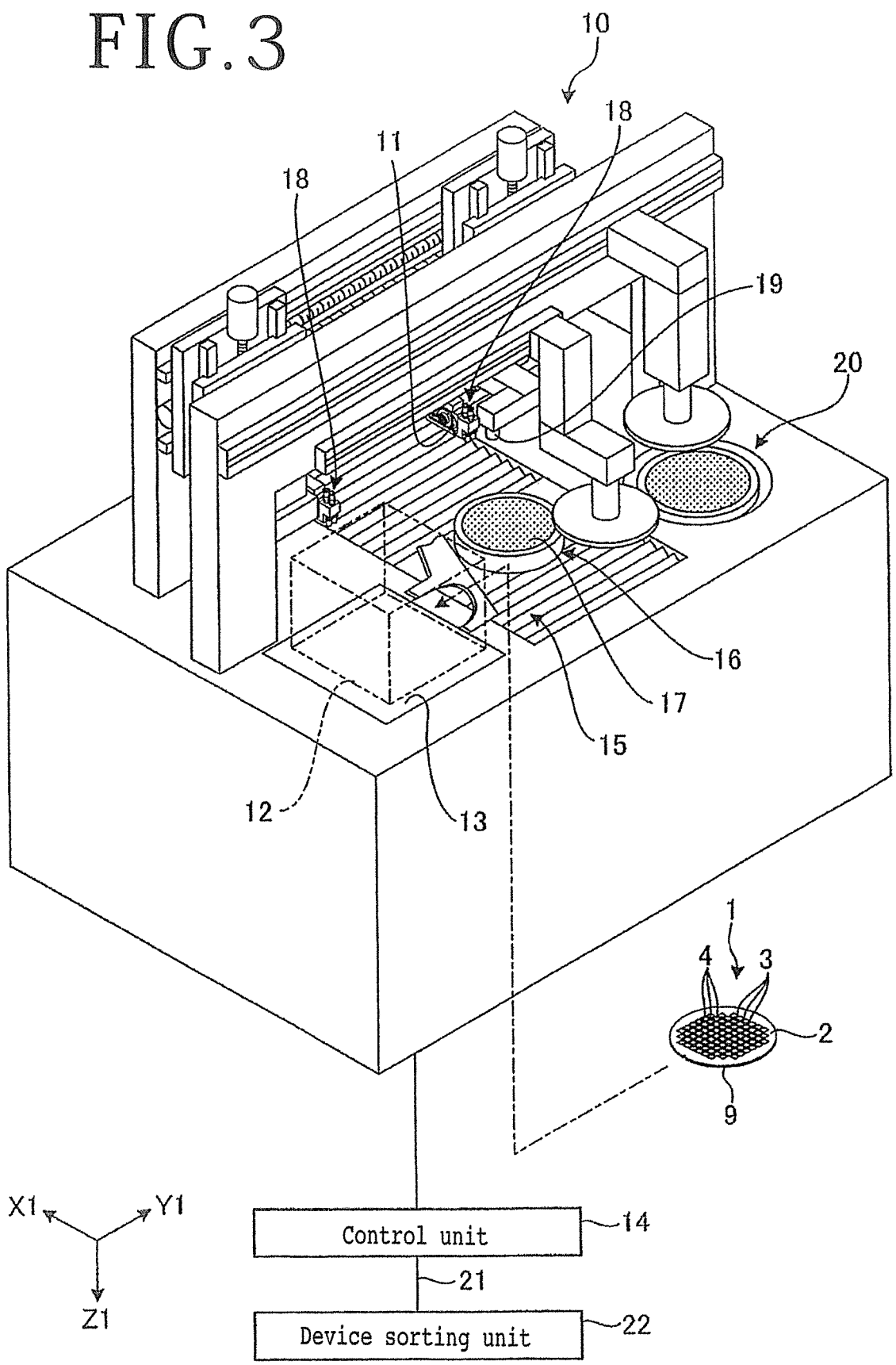
FIG. 3 is a perspective view of a cutting apparatus used in a cutting step of the method of processing a wafer illustrated in FIG. 2.
Figure 4:
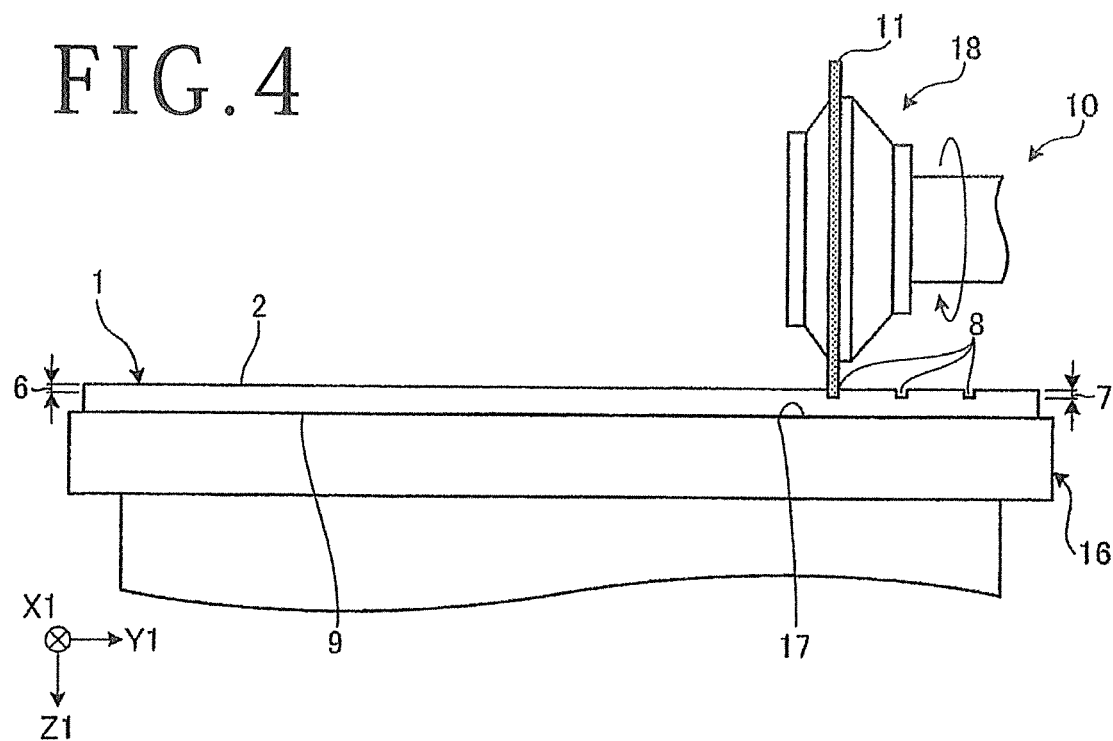
FIG. 4 is a side elevational view illustrating the cutting step of the method of processing a wafer illustrated in FIG. 2.

FIG. 3 is a perspective view of a cutting apparatus used in the cutting step of the wafer processing method illustrated in FIG. 2. FIG. 4 is a side elevational view illustrating the cutting step of the wafer processing method illustrated in FIG. 2. The cutting step ST1 is performed using the cutting apparatus, denoted by 10, illustrated in FIG. 3. The cutting step ST1 is a step of cutting the face side 2 of the wafer 1 with a cutting blade 11 of the cutting apparatus 10 to form a groove 8, depicted in FIG. 4, in the face side 2 to a depth 7 in excess of a finished thickness 6, depicted in FIG. 1, of the wafer 1 along the projected dicing lines 3.

In the cutting step ST1 according to Embodiment 1, the operator or the like of the cutting apparatus 10 places a plurality of wafers 1 with their face sides 2 facing upwardly into a cassette 12, and puts the cassette 12 on a cassette elevator 13. The cutting step ST1 is carried out by the cutting apparatus 10 when the operator registers processing details information including the depth 7 of the groove 8, etc. in a control unit 14 of the cutting apparatus 10, and the control unit 14 accepts a start command for a processing operation from the operator.

In the cutting step ST1, when the cutting apparatus 10 starts the processing operation, the control unit 14 controls a feed unit 15 to take a wafer 1 to be cut from the cassette 12 and to place the wafer 1 on a chuck table 16 where a reverse side 9 of the wafer 1 is held under suction on a holding surface 17 of the chuck table 16. Then, the control unit 14 controls an X-axis moving unit to move the chuck table 16 to a position below a cutting unit 18. The control unit 14 controls an image capturing unit 19 to capture an image of the face side 2 of the wafer 1, and performs an alignment process on the wafer 1 based on the image captured by the image capturing unit 19. Then, as illustrated in FIG. 4, the control unit 14 moves the wafer 1 and the cutting unit 18 relatively to each other along the projected dicing lines 3 that belong to one of the first and second groups, causes the cutting blade 11 of the cutting unit 18 to incise the face side 2 of the wafer 1, forming grooves 8 in the face side 2 along the projected dicing lines 3. Then, the control unit 14 controls a cleaning unit 20 to clean the wafer 1 with the grooves 8 formed therein, after which the wafer 1 is held again on the holding surface 17 of the chuck table 16. Thereafter, the wafer processing method according to Embodiment 1 goes from the cutting step ST1 to the first inspecting step ST2.

(First Inspecting Step)

Figure 5:
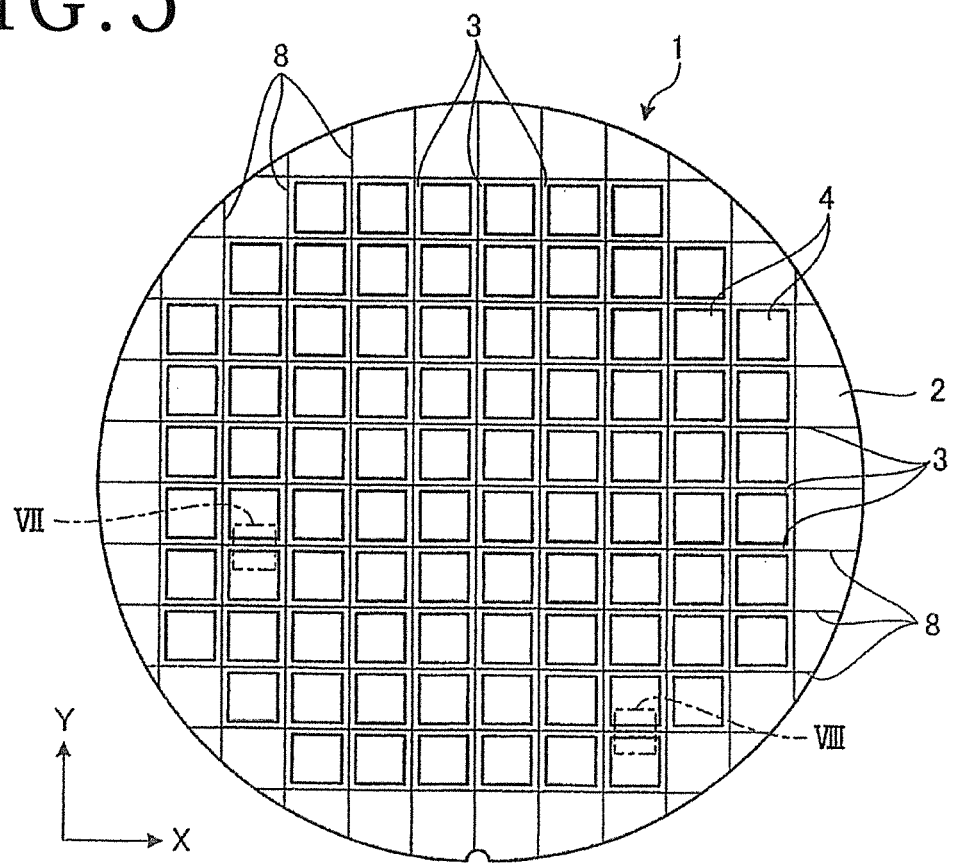
FIG. 5 is a plan view of a wafer to be inspected in a first inspecting step of the method of processing a wafer illustrated in FIG. 2.
Figure 6:
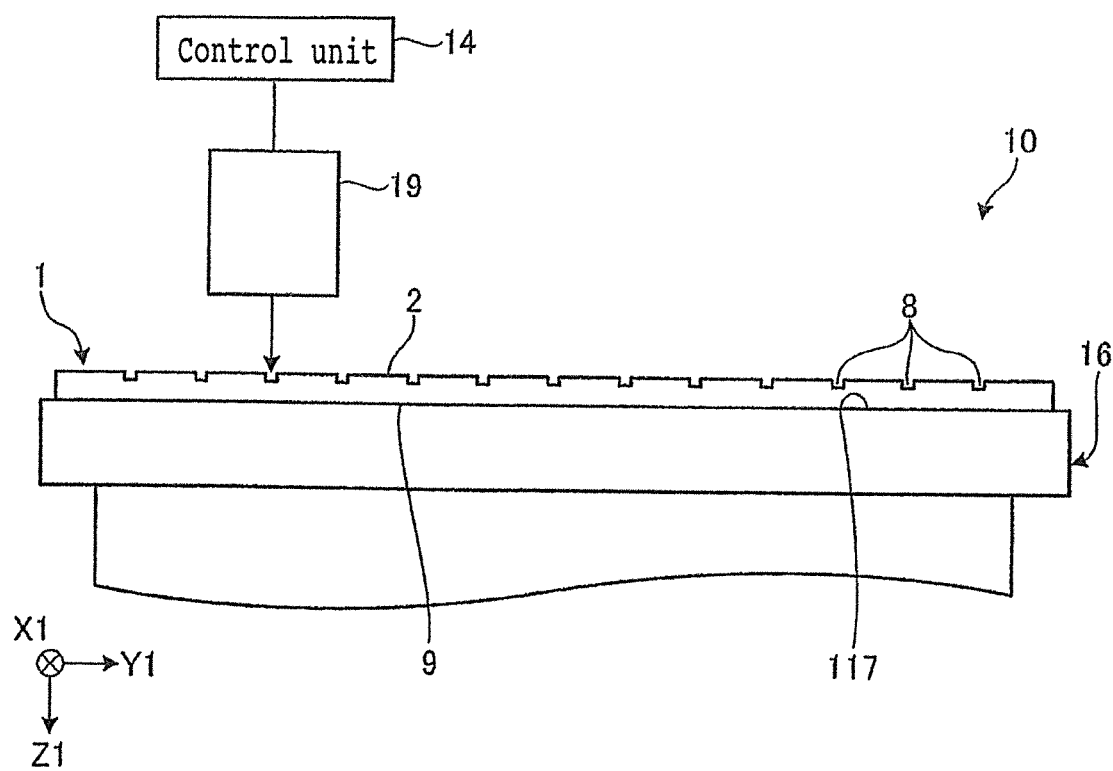
FIG. 6 is a side elevational view illustrating the first inspecting step of the method of processing a wafer illustrated in FIG. 2.
Figure 7:
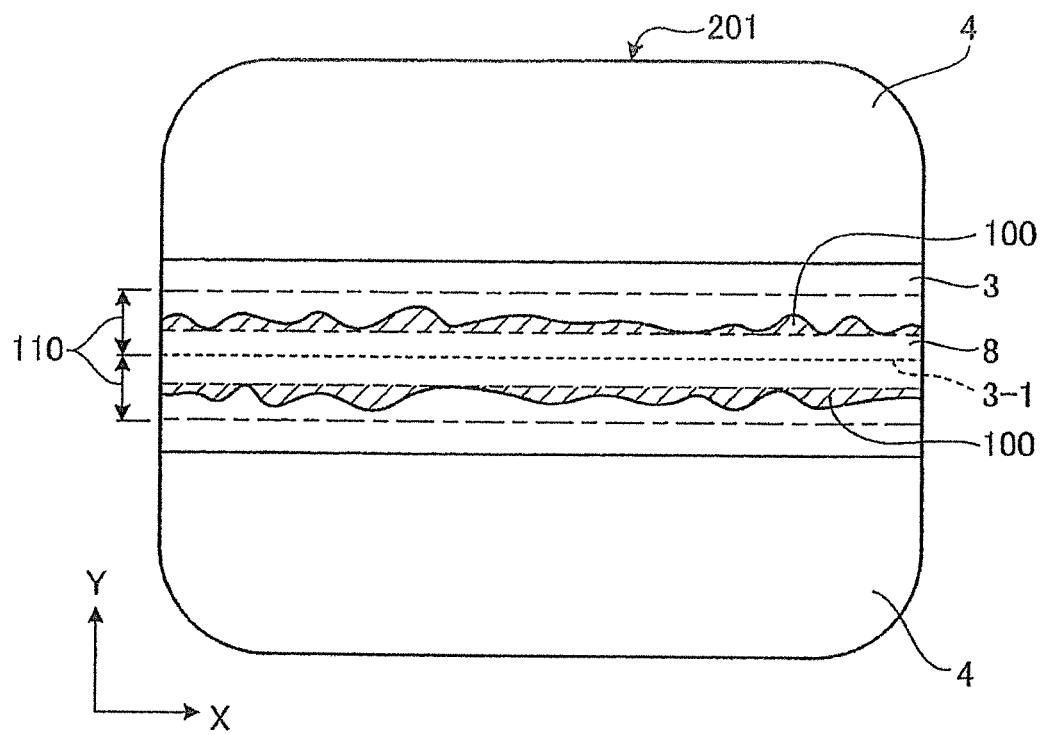
FIG. 7 is a view of an image captured of a portion VII illustrated in FIG. 5.
Figure 8:
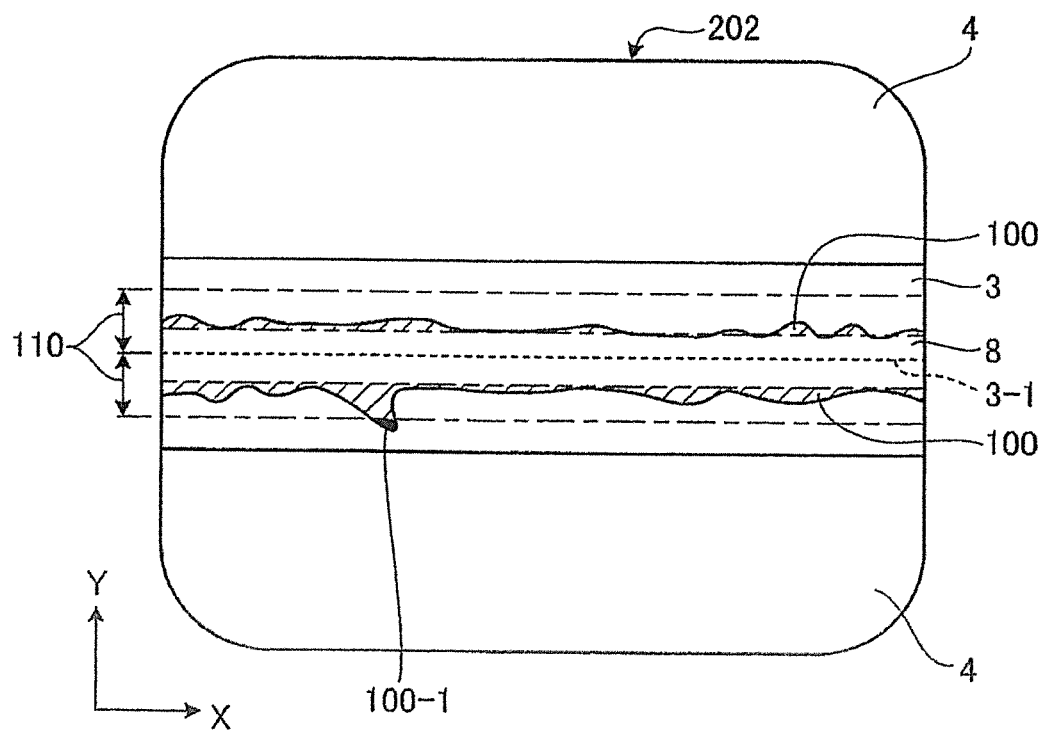
FIG. 8 is a view of an image captured of a portion VIII illustrated in FIG. 5.

FIG. 5 is a plan view of a wafer to be inspected in the first inspecting step of the wafer processing method illustrated in FIG. 2. FIG. 6 is a side elevational view illustrating the first inspecting step of the wafer processing method illustrated in FIG. 2. FIG. 7 is a view of an image captured of a portion VII illustrated in FIG. 5. FIG. 8 is a view of an image captured of a portion VIII illustrated in FIG. 5.

The first inspecting step ST2 is a step of capturing an image of each of the grooves 8 formed in the cutting step ST1 from the face side 2 of the wafer 1 and inspecting the state of chips (dents, cracks) 100, depicted in FIGS. 7 and 8, in the edge portions of the groove 8 whose image has been captured. As illustrated in FIG. 5, the wafer 1 to be inspected in the first inspecting step ST2 according to Embodiment 1 has grooves 8 formed therein along all the projected dicing lines 3. In the first inspecting step ST2, as depicted in FIG. 6, the control unit 14 moves the wafer 1 and the image capturing unit 19 relatively to each other along the projected dicing lines 3 and controls the image capturing unit 19 to successively capture images of all the projected dicing lines 3 along which the grooves 8 have been formed. The image capturing unit 19 then outputs captured images 201 and 202, depicted in FIGS. 7 and 8, successively to the control unit 14.

In the first inspecting step ST2, the control unit 14 detects a transverse center 3-1, indicated by the broken line in FIGS. 7 and 8, of a projected dicing line 3 and a groove 8 formed therealong, from the images 201 and 202. According to the present invention, any of various image processing processes including a binarizing process, a gray scaling process, and so on may be used for the control unit 14 to detect grooves 8. As indicated by the two-dot-and-dash lines in FIGS. 7 and 8, a groove 8 should preferably be formed straight to a width corresponding to the thickness of the cutting blade 11 across and along the transverse center 3-1 of the projected dicing line 3. Since, however, a groove 8 is formed by a mechanical operation of the cutting apparatus 10, chips 100, depicted coarsely hatched in FIGS. 7 and 8, are formed in transversely spaced opposite edge portions of the groove 8. Each of the chips 100 is formed when part of the base material of the wafer 1 is broken off from the edge portion of the groove 8 that extends from the face side 2 to the groove 8.

In the first inspecting step ST2, the control unit 14 determines in each of the images 201 and 202 whether or not the groove 8 includes a portion 100-1, depicted densely hatched in FIGS. 7 and 8, that exceeds a range extending from the transverse center 3-1 of the projected dicing line 3 over a predetermined distance 110, indicated by the dot-and-dash lines in FIGS. 7 and 8. If the control unit 14 determines that the groove 8 includes a portion 100-1 that exceeds the range extending from the transverse center 3-1 of the projected dicing line 3 over the predetermined distance 110, then the control unit 14 recognizes the portion 100-1 that exceeds the range extending from the transverse center 3-1 over the predetermined distance 110, as a chip (dent, crack) 100-1 that is not allowable for the divided device 4 as a product.

In the first inspecting step ST2, the control unit 14 calculates the positions in X-axis and Y-axis directions of the portion 100-1, i.e., the chip 100-1 on the wafer 1 that is not allowable for the divided device 4 as a product, based on the detection result from a detecting unit that detects the relative positions in X1-axis and Y1-axis directions of the cutting unit 18 and the image capturing unit 19, and the wafer 1, and the position of the portion 100-1 in the image 202, and stores the calculated positions.

Thus, the first inspecting step ST2 determines whether a portion 100-1 that exceeds the range extending from the transverse center 3-1 of the projected dicing line 3 over the predetermined distance 110 is present in the groove 8 or not, and also acquires positional information of the groove 8. Furthermore, the first inspecting step ST2 also calculates the positions in the X-axis and Y-axis directions of the portion 100-1, i.e., the chip 100-1 on the wafer 1 that is not allowable for the divided device 4 as a product, and stores the calculated positions, thereby acquiring positional information of the inspected chip 100-1. Thereafter, the wafer processing method according to Embodiment 1 goes from the first inspecting step ST2 to the first NG device determining step ST3.
(First NG Device Determining Step)

The first NG device determining step ST3 is a step of determining NG (No Good) device chips among a plurality of device chips 5 made from the wafer 1 based on the inspection result of the first inspecting step ST2. According to Embodiment 1, an NG device chip refers to a device chip 5 that has a chip 100-1 that is not allowable for a product.

In the first NG device determining step ST3, according to Embodiment 1, the control unit 14 extracts a device chip 5 where a chip 100-1 that is not allowable for the device 4 as a product is present on an outer edge thereof, on the face side 2 of the wafer 1, based on the position of a chip 100-1 that is not allowable for the device 4 as a product on the face side 2 of the wafer 1 as represented by the inspection result of the first inspecting step ST2 on each wafer 1. In the first NG device determining step ST3, the control unit 14 determines a device chip 5 where a chip 100-1 that is not allowable for the device 4 as a product is present on an outer edge thereof as an NG device chip, calculates the position of the NG device chip, and stores the calculated position. In the first NG device determining step ST3, according to Embodiment 1, the control unit 14 stores the positions in the X-axis and Y-axis directions of the NG device chip on the wafer 1 in association with each wafer 1.

According to Embodiment 1, the cutting step ST1, the first inspecting step ST2, and the first NG device determining step ST3 are carried out on the wafer 1 using the cutting apparatus 10 illustrated in FIG. 3. When the cutting step ST1, the first inspecting step ST2, and the first NG device determining step ST3 have been carried out on all the wafers 1 from the cassette 12, the wafer processing method goes to the protecting member sticking step ST4. According to the present invention, while a groove 8 is being formed in the wafer 1 in the cutting step ST1, the first inspecting step ST2 and the first NG device determining step ST3 may be carried out on the projected dicing line 3 where a groove 8 has already been formed, using the cutting apparatus 10 illustrated in FIG. 3. According to the present invention, furthermore, a groove 8 may be formed in the wafer 1 using the cutting apparatus 10 illustrated in FIG. 3, and the first inspecting step ST2 and the first NG device determining step ST3 may be carried out on the wafer 1 where the groove 8 has been formed, using another inspecting apparatus than the cutting apparatus 10.

According to Embodiment 1, the control unit 14 controls the components, referred to above, of the cutting apparatus 10 to cause the cutting apparatus 10 to process the wafer 1. The control unit 14 is a computer including a processing device having a microprocessor such as a CPU (Central Processing Unit), a storage device having a memory such as a ROM (Read Only Memory) or a RAM (Random Access Memory), and an input/output interface device. The processing device of the control unit 14 performs arithmetic and processing operations according to computer programs stored in the storage device and outputs control signals for controlling the cutting apparatus 10 via the input/output interface device to the components of the cutting apparatus 10.

The control unit 14 is connected to a display unit, not depicted, such as a liquid crystal display unit displaying processing operation states and images and an input unit that is used when the operator registers processing details information, etc. The input unit includes at least one of a touch panel on the display unit and an external input device such as a keyboard or the like. According to Embodiment 1, the control unit 14 is connected to a device sorting unit 22 through a network 21. The network 21 may be a LAN (Local Area Network) or a wide area communication network (WAN: Wide Area Network) such as the Internet or the like.

(Protective Member Sticking Step)

Figure 9:
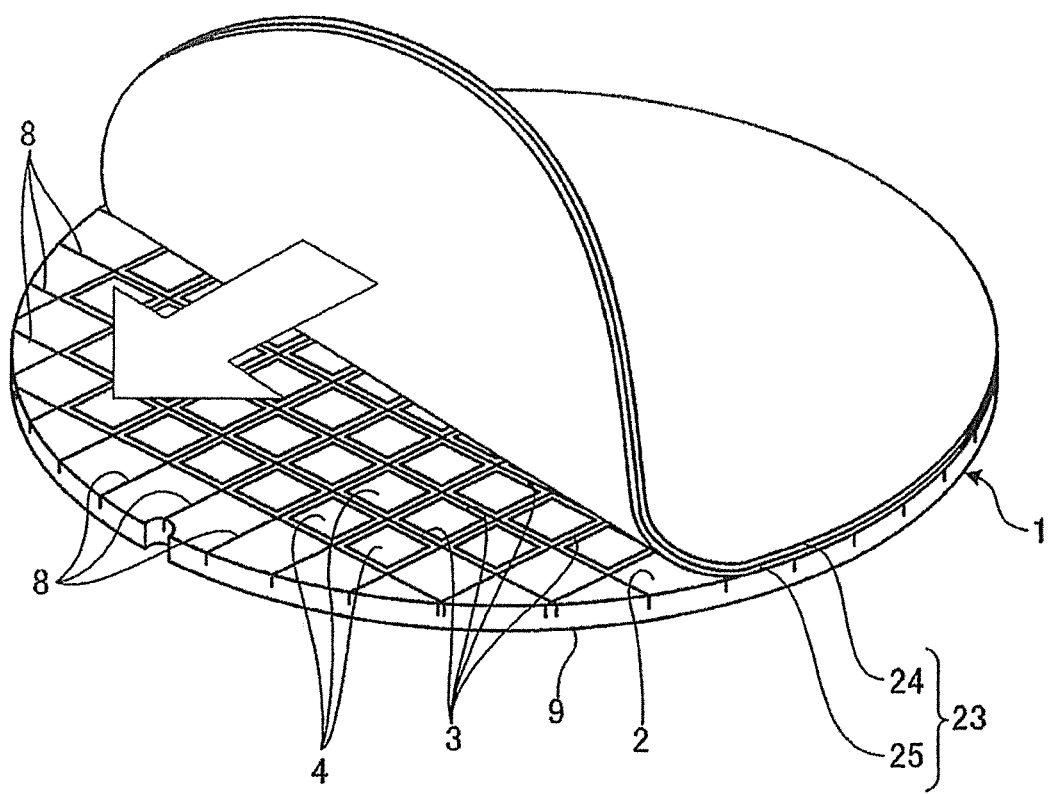
FIG. 9 is a perspective view illustrating a protective member sticking step of the method of processing a wafer illustrated in FIG. 2.

FIG. 9 is a perspective view illustrating a protective member sticking step of the wafer processing method illustrated in FIG. 2. The protective member sticking step ST4 is a step of sticking a protective member 23 to the face side 2 of the wafer 1 after the first inspecting step ST2 has been carried out. In the protective member sticking step ST4, as illustrated in FIG. 9, the protective member 23 that is of the same diameter as the wafer 1 is stuck to the face side 2 thereof. According to Embodiment 1, the protective member 23 includes a base layer 24 made of synthetic resin and an adhesive layer 25 stacked on the base layer 24 and adapted to be stuck to the face side 2 of the wafer 1. When the protective member 23 has been stuck to the face side 2 of the wafer 1, the wafer processing method goes to the grinding step ST5. A grinding apparatus according to Embodiment 1 which is to be used in the grinding step ST5 will be described below with reference to the drawings.

(Grinding Apparatus)

Figure 10:
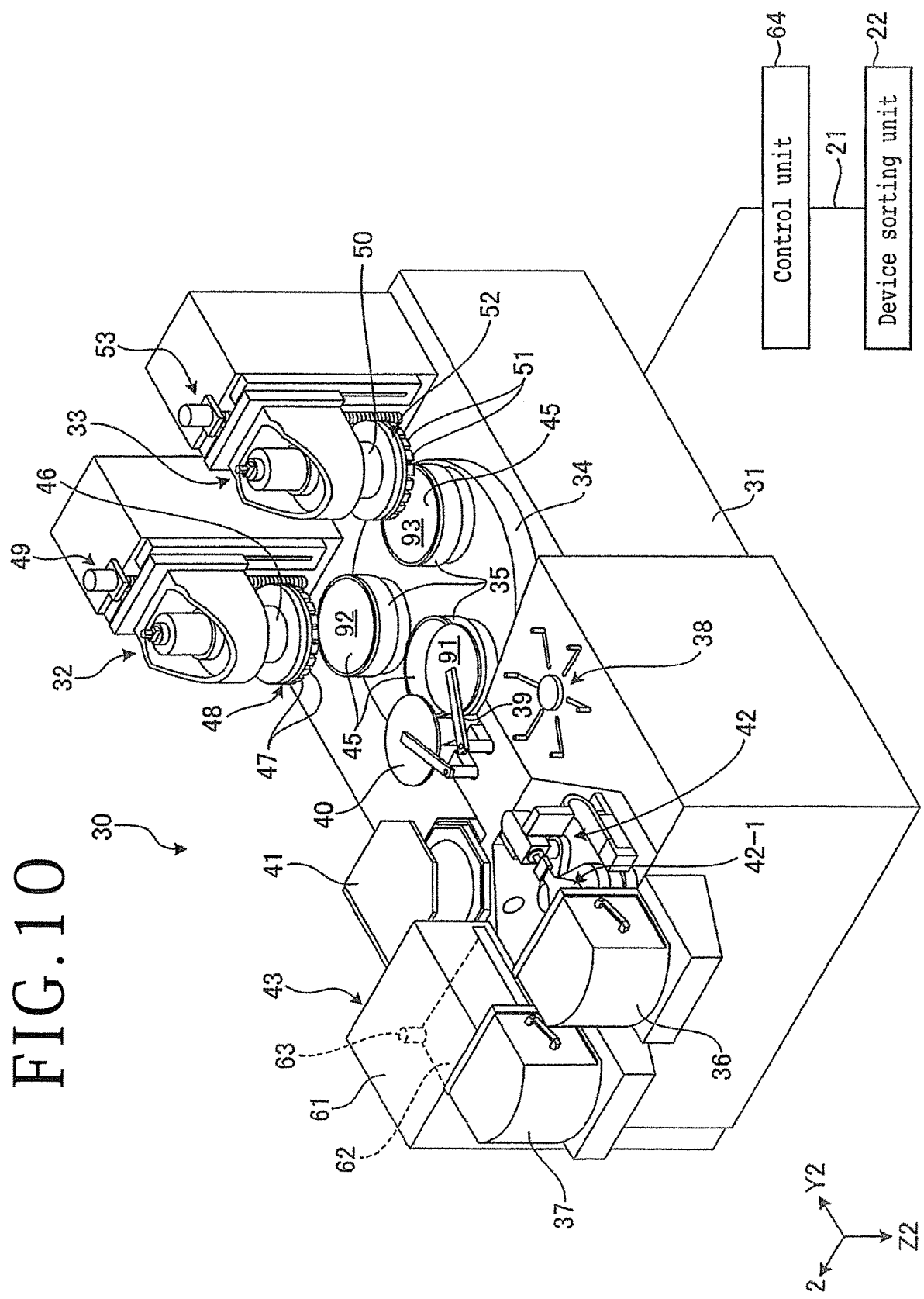
FIG. 10 is a perspective view of a grinding apparatus according to Embodiment 1.

FIG. 10 is a perspective view of a grinding apparatus according to Embodiment 1. The grinding apparatus, denoted by 30 in FIG. 10, is an apparatus used in the grinding step ST5 of the wafer processing method according to Embodiment 1. The grinding apparatus 30 grinds the reverse side 9 of the wafer 1 to thin the wafer 1 to the finished thickness 6, thereby dividing the wafer 1 into individual device chips 5. The grinding apparatus 30 also inspects the divided device chips 5 for chips (dents, cracks) 101 illustrated in FIGS. 14 and 15 on the reverse sides 9 thereof.

As illustrated in FIG. 10, the grinding apparatus 30 mainly includes an apparatus body 31, a first grinding unit 32, a second grinding unit 33, a plurality of, e.g., three, chuck tables 35 disposed on a turntable 34, a pair of cassettes 36 and 37, a positioning unit 38, a loading unit 39, an unloading unit 40, a cleaning unit 41, an unloading/loading unit 42, and an inspecting unit 43.

The turntable 34 is a disk-shaped table mounted on an upper surface of the apparatus body 31 for rotation in a horizontal plane, and is rotated about its own axis at predetermined timings. The three chuck tables 35, for example, are disposed on the turntable 34 at angular intervals of 120 degrees, for example. Each of the three chuck tables 35 is of a holding table structure having a vacuum chuck on a holding surface 45 thereof. Each chuck table 35 holds a wafer 1 that is placed on the holding surface 45 with the protective member 33 interposed therebetween, under a suction force applied by the vacuum chuck. During a grinding process, the chuck tables 35 are rotated in a horizontal plane about their vertical axes by rotating mechanisms. When the turntable 34 rotates in the horizontal plane, each of the chuck tables 35 moves successively to a loading/unloading position 91, a rough grinding position 92, a finishing grinding position 93, and back to the loading/unloading position 91.

The first grinding unit 32 is a grinding unit that includes a spindle 46 rotatable about a rotational axis perpendicular to the holding surface 45 of one of the chuck tables 35 and a grinding wheel 48 for rough grinding that is mounted on the spindle 46 and has a plurality of grinding stones 47 for rough grinding. The first grinding unit 32 performs rough grinding on the reverse side 9 of the wafer 1 held on the chuck table 35. The grinding wheel 48 is mounted on the lower end of the spindle 46 that is movable in a Z2-axis direction parallel to vertical directions by a Z-axis moving unit 49. The first grinding unit 32 performs rough grinding on the reverse side 9 of the wafer 1 held on the chuck table 35 in the rough grinding position 92 as the grinding stones 47 for rough grinding are moved at a predetermined feed speed toward the chuck table 35 by the Z-axis moving unit 49 while the grinding wheel 48 is being rotated by the spindle 46 and grinding water is being supplied to the reverse side 9 of the wafer 1.

The second grinding unit 33 is a grinding unit that includes a spindle 50 rotatable about a rotational axis perpendicular to the holding surface 45 of one of the chuck tables 35 and a grinding wheel 52 for finishing grinding that is mounted on the spindle 50 and has a plurality of grinding stones 51 for finishing grinding. The second grinding unit 33 performs finishing grinding on the reverse side 9 of the wafer 1 held on the chuck table 35. The grinding wheel 52 is mounted on the lower end of the spindle 50 that is movable in the Z2-axis direction parallel to the vertical directions by a Z-axis moving unit 53. The second grinding unit 33 performs finishing grinding on the reverse side 9, which has been rough-ground, of the wafer 1 held on the chuck table 35 in the finishing grinding position 93 as the grinding stones 51 for finishing grinding are moved at a predetermined feed speed toward the chuck table 35 by the Z-axis moving unit 53 while the grinding wheel 51 is being rotated by the spindle 50 and grinding water is being supplied to the reverse side 9 of the wafer 1.

The grinding apparatus 30 thins the wafer 1 to the finished thickness 6 by performing rough grinding on the reverse side 9 of the wafer 1 with the first grinding unit 32 and then finishing grinding on the reverse side 9 of the wafer 1 with the second grinding unit 33. When the grinding apparatus 30 thins the wafer 1 to the finished thickness 6, the grooves 8 are exposed on the reverse side 9 of the wafer 1, dividing the wafer 1 into individual device chips 5.

Each of the cassettes 36 and 37 is a receptacle for storing wafers 1 therein, and has a plurality of slots therein. Each of the cassettes 36 and 37 stores therein wafers 1 with their reverse sides 9 facing upwardly. One of the cassettes 36 stores therein wafers 1 to be ground, whereas the other cassette 37 stores therein wafers 1 that have been ground. The positioning unit 38 is a table for temporarily placing a wafer 1 removed from the cassette 36 and centering the wafer 1.

Each of the loading unit 39 and the unloading unit 40 has a suction pad for attracting a wafer 1 under suction. The loading unit 39 holds under suction a wafer 1 to be ground that has been centered by the positioning unit 38 and loads the wafer 1 onto the chuck table 35 that is positioned in the loading/unloading position 91. The unloading unit 40 holds under suction a wafer 1 that has been ground which is held on the chuck table 35 that is positioned in the loading/unloading position 91 and unloads the wafer 1 to the cleaning unit 41.

The unloading/loading unit 42 is a picking robot having a circular hand 42-1, for example, and holds a wafer 1 under suction and carries the wafer 1 with the circular hand 42-1. Specifically, the unloading/loading unit 42 removes a wafer 1 to be ground from the cassette 36, unloads the wafer 1 to the positioning unit 38, removes a ground wafer 1 from the cleaning unit 41, and inserts the wafer 1 into the inspecting unit 43. The unloading/loading unit 42 also carries a wafer 1 inspected by the inspecting unit 43 from the inspecting unit 43 into the cassette 37. The cleaning unit 41 cleans a ground wafer 1 to remove contaminants such as ground debris or the like from the ground reverse side 9 of the wafer 1.

The inspecting unit 43 includes a box-shaped unit case 61 into and out which ground and cleaned wafers 1 are taken by the unloading/loading unit 42, a holding member 62 holding a ground or cleaned wafer 1, a camera 63 for capturing an image of the reverse side 9 of the wafer 1 held by the holding member 62, a moving unit, not depicted, moving the wafer 1 and the camera 63 relatively to each other, and a control unit 64. The holding member 62, the camera 63, and the moving unit are installed in the unit case 61.

The camera 63 captures an image of the grooves 8 exposed on the reverse side 9 of the wafer 1 from the side of the reverse side 9, and outputs the captured image to the control unit 64. The camera 63 has an image capturing device for capturing an image of the reverse side 9 of the wafer 1. The image capturing device may be a CCD (Charge-Coupled Device) or a CMOS (Complementary Metal Oxide Semiconductor) sensor. According to Embodiment 1, the camera 63 is an infrared camera. The moving unit may include a known electric motor, ball screw, a slider, and so on. The moving unit moves the wafer 1 and the camera 63 relatively to each other along the projected dicing lines 3 on the wafer 1.

The control unit 64 inspects the grooves 8 for chips 101 from the image captured by the camera 63. The control unit 64 also controls the above components of the grinding apparatus 30 to cause the grinding apparatus 30 to process the wafer 1. The control unit 64 is a computer including a processing device having a microprocessor such as a CPU, a storage device having a memory such as a ROM or a RAM, and an input/output interface device. The processing device of the control unit 64 performs arithmetic and processing operations according to computer programs stored in the storage device and outputs control signals for controlling the grinding apparatus 30 via the input/output interface device to the components of the grinding apparatus 30.

The control unit 64 is connected to a display unit, not depicted, such as a liquid crystal display unit displaying processing operation states and images and an input unit that is used when the operator registers processing details information, etc. The input unit includes at least one of a touch panel on the display unit and an external input device such as a keyboard or the like. According to Embodiment 1, the control unit 64 is connected to a device sorting unit 22 through a network 21. The grinding step ST5 of the wafer processing method according to Embodiment 1 will be described below.

(Grinding Step)

Figure 11:
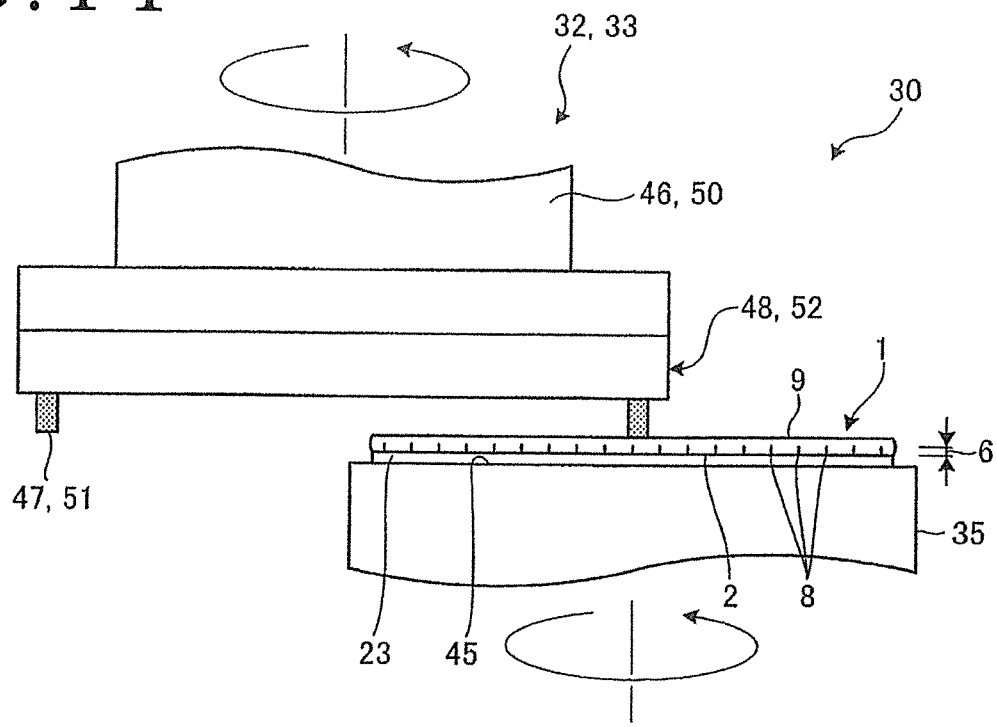
FIG. 11 is a side elevational view illustrating a grinding step of the method of processing a wafer illustrated in FIG. 2.

FIG. 11 is a side elevational view illustrating a grinding step of the wafer processing method illustrated in FIG. 2. The grinding step ST5 is a step of holding the protective member 23 side of a wafer 1 on one of the chuck tables 35 of the grinding apparatus 30 and grinding the reverse side 9 of the wafer 1 to the finished thickness 6 for thereby dividing the wafer 1 into device chips 5 including respective devices 4.

In the grinding step ST5 according to Embodiment 1, the operator or the like of the grinding apparatus 30 places a wafer 1 to be ground with the protective member 23 stuck to the face side 2 thereof into the cassette 36. In the grinding step ST5, the operator registers processing details information in the control unit 64, and installs the cassette 36 storing therein the wafer 1 to be ground and the cassette 37 free of wafers 1 on the apparatus body 31. When the control unit 64 accepts a start command for a processing operation from the operator, the grinding apparatus 30 carries out the remainder of the grinding step ST5.

In the grinding step ST5, the control unit 64 controls the unloading/loading unit 42 to take the wafer 1 out of the cassette 36 and unload the wafer 1 to the positioning unit 38. The control unit 64 controls the positioning unit 38 to center the wafer 1 and also controls the loading unit 39 to load the wafer 1 onto the chuck table 35 positioned in the loading/unloading position 91 such that the face side 2 side of the centered wafer 1 confronts the chuck table 35.

The control unit 64 controls the chuck table 35 in the loading/unloading position 91 to hold the face side 2 side of the wafer 1 with the protective member 23 interposed therebetween, thereby exposing the reverse side 9 of the wafer 1. The control unit 64 turns the turntable 34 to bring the wafer 1 successively to the rough grinding position 92, the finishing grinding position 93, and back to the loading/unloading position 91, so that rough grinding and finishing grinding are successively performed on the wafer 1. In the rough grinding position 92 and the finishing grinding position 93, as illustrated in FIG. 11, the grinding apparatus 30 rotates the respective chuck tables 35 about their vertical axes, and presses the grinding stones 47 and 51 of the grinding wheels 48 and 52 that are rotated by the respective spindles 46 and 50 against the reverse side 9 of the wafer 1. Each time the turntable 34 is turned through 120 degrees, the control unit 64 loads a wafer 1 to be ground onto the chuck table 35 in the loading/unloading position 91. In the grinding step ST5, rough grinding and finishing grinding are carried out on the wafer 1, exposing the grooves 8 on the reverse side 9 thereby to divide the wafer 1 into individual device chips 5.

The control unit 64 loads a ground wafer 1 into the cleaning unit 41 with the unloading unit 40, cleans the wafer 1 with the cleaning unit 41, holds the cleaned wafer 1 on a carrier pad of the unloading/loading unit 42, and inserts the wafer 1 into the unit case 61 of the inspecting unit 43 where the wafer 1 is placed on the holding member 62. The control unit 64 holds the wafer 1 on the holding member 62. The wafer processing method according to Embodiment 1 then goes to the second inspecting step ST6.

(Second Inspecting Step)

Figure 12:
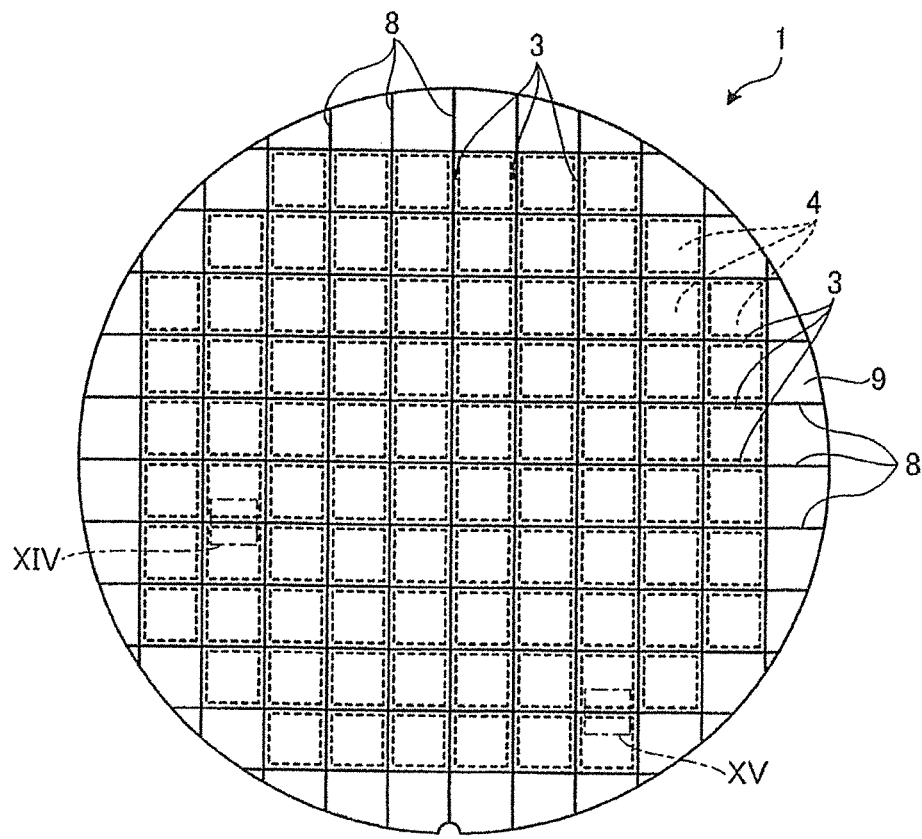
FIG. 12 is a plan view of a wafer to be inspected in a second inspecting step of the method of processing a wafer illustrated in FIG. 2.
Figure 13:
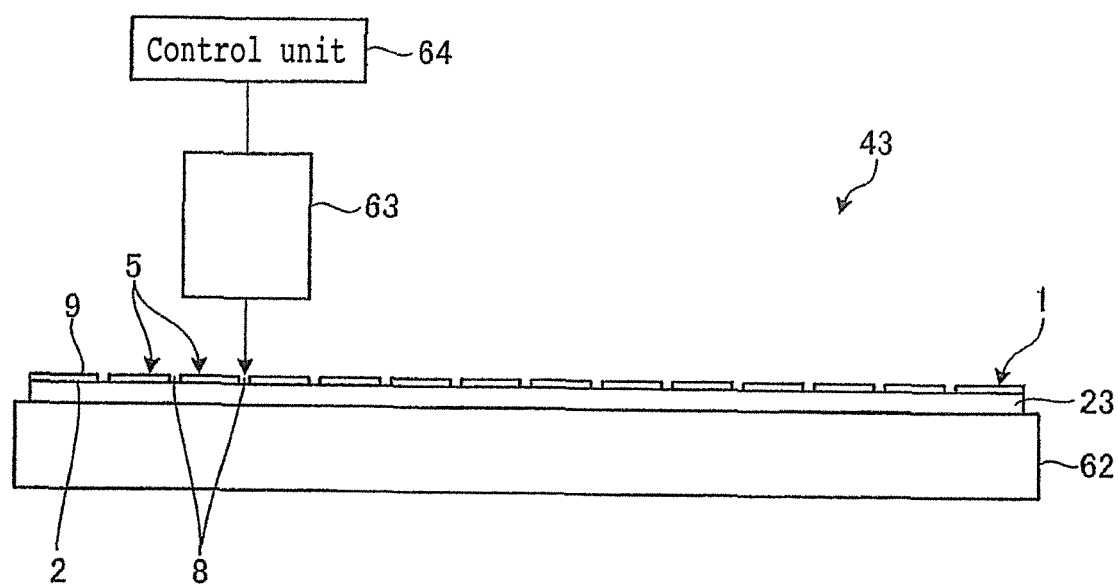
FIG. 13 is a side elevational view illustrating the second inspecting step of the method of processing a wafer illustrated in FIG. 2.
Figure 14:
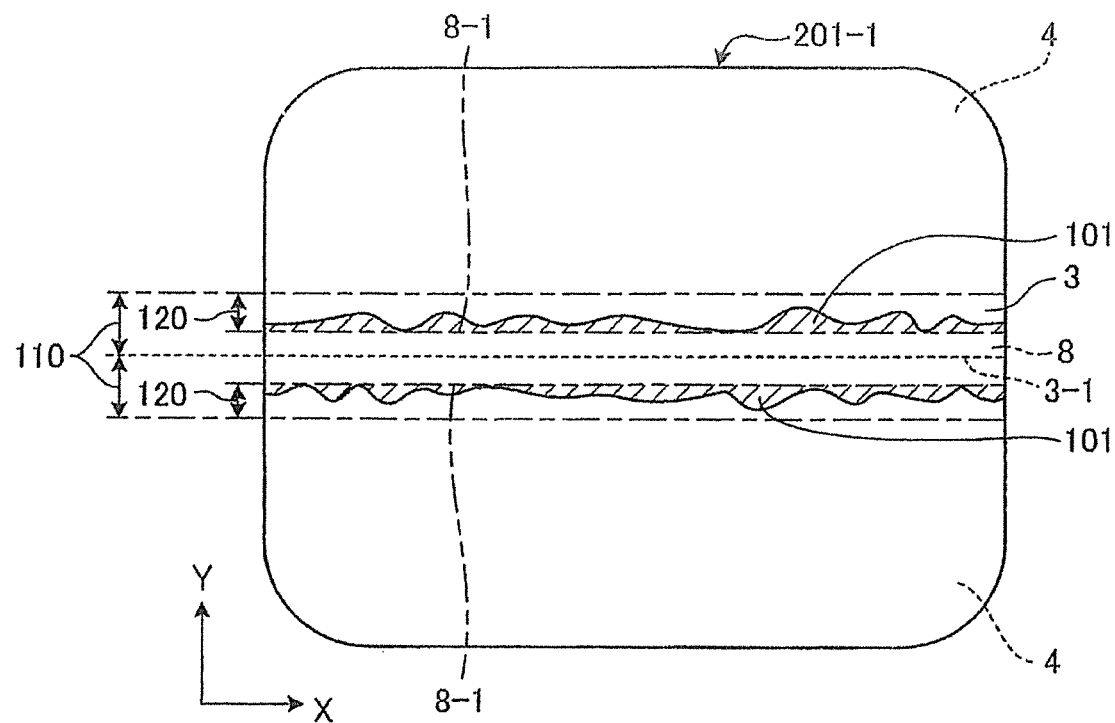
FIG. 14 is a view of an image captured of a portion XIV illustrated in FIG. 12.
Figure 15:
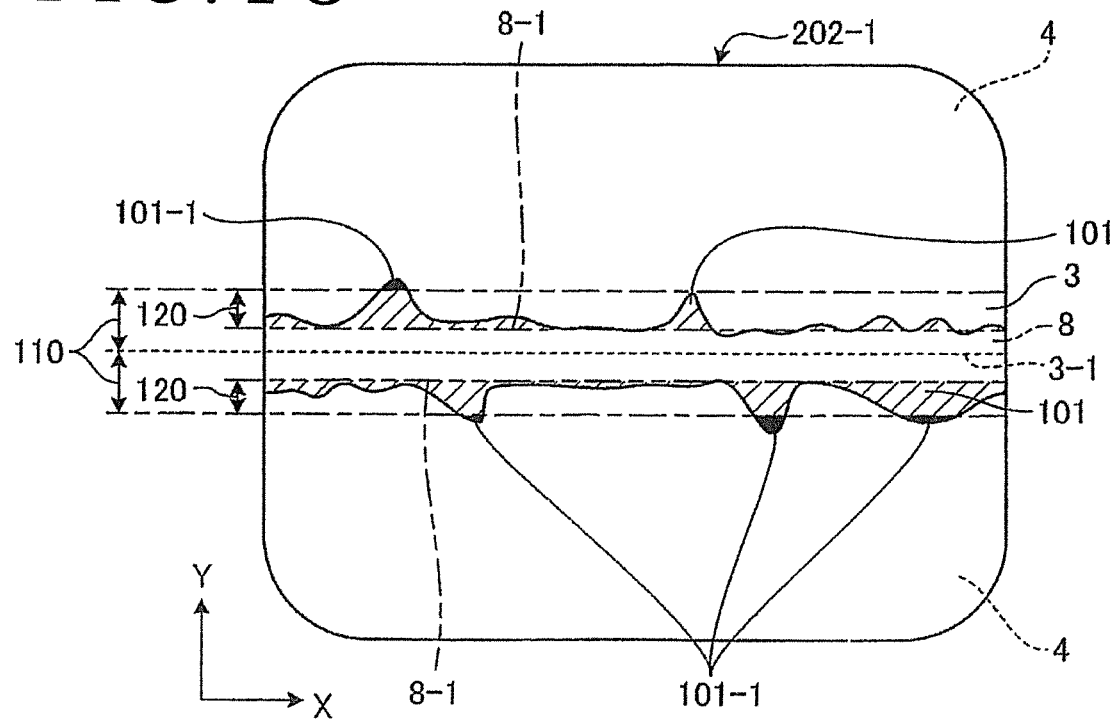
FIG. 15 is a view of an image captured of a portion XV illustrated in FIG. 12.

FIG. 12 is a plan view of a wafer to be inspected in a second inspecting step of the wafer processing method illustrated in FIG. 2. FIG. 13 is a side elevational view illustrating the second inspecting step of the wafer processing method illustrated in FIG. 2. FIG. 14 is a view of an image captured of a portion XIV illustrated in FIG. 12. FIG. 15 is a view of an image captured of a portion XV illustrated in FIG. 12.

The second inspecting step ST6 is a step of capturing an image of each of the grooves 8 exposed on the reverse side 9 of the wafer 1 from the reverse side 9 and inspecting the state of chips 101, depicted in FIGS. 14 and 15, in the edge portions of the groove 8 whose image has been captured, after the grinding step ST5 has been carried out. As illustrated in FIG. 12, the wafer 1 to be inspected in the second inspecting step ST6 according to Embodiment 1 has grooves 8 exposed on the reverse side 9 thereof. In the second inspecting step ST6 according to Embodiment 1, as depicted in FIG. 13, the control unit 64 of the grinding apparatus 30 moves the wafer 1 and the camera 63 relatively to each other along the projected dicing lines 3 and controls the camera 63 to successively capture images of all the projected dicing lines 3 along which the grooves 8 are exposed on the reverse side 9. The camera 63 then outputs captured images 201-1 and 202-1, depicted in FIGS. 14 and 15, successively to the control unit 64.

In the second inspecting step ST6, the control unit 64 detects grooves 8 and chips 101 from the images 201-1 and 201-2. According to the present invention, any of various image processing processes including a binarizing process, a gray scaling process, and so on may be used for the control unit 64 to detect grooves 8 and chips 101. A groove 8 should preferably be formed straight to a width corresponding to the thickness of the cutting blade 11. Since, however, a groove 8 is formed by a mechanical operation of the cutting apparatus 10 and exposed on the reverse side 9 by a mechanical operation of the grinding apparatus 30, chips 101, depicted coarsely hatched in FIGS. 14 and 15, are formed in transversely spaced opposite edge portions of the groove 8. Each of the chips 101 is formed when part of the base material of the wafer 1 is broken off from the edge portion of the groove 8 that extends from the reverse side 9 to the groove 8.

In the second inspecting step ST6, the control unit 14 determines in each of the images 201-1 and 202-1 whether or not the groove 8 includes a portion 101-1, depicted densely hatched in FIG. 15, that exceeds a range extending from an edge 8-1 over a predetermined distance 120, indicated by the dot-and-dash lines in FIGS. 14 and 15. If the control unit 64 determines that the groove 8 includes a portion 101-1 that exceeds the range extending from the transverse center 3-1 of the projected dicing line 3 over the predetermined distance 120, then the control unit 64 recognizes the portion 101-1 that exceeds the range extending from the transverse center 3-1 over the predetermined distance 120, as a chip (dent, crack) 101-1 that is not allowable for the divided device 4 as a product.

In the second inspecting step ST6, the control unit 64 calculates the positions in X-axis and Y-axis directions of the portion 101-1, i.e., the chip 101-1 on the wafer 1 that is not allowable for the divided device 4 as a product, based on the detected result from a detecting unit of the grinding apparatus 30 that detects the relative positions of the camera 63 and the wafer 1, and the position of the portion 101-1 in the image 202-1, and stores the calculated positions.

Thus, the second inspecting step ST6 determines whether a portion 101-1 that exceeds the range extending from the edges 8-1 of the groove 8 over the predetermined distance 120 is present in the groove 8 or not, and also acquires positional information of the groove 8. Furthermore, the second inspecting step ST6 also calculates the positions in the X-axis and Y-axis directions of the portion 101-1, i.e., the chip 101-1 on the wafer 1 that is not allowable for the divided device 4 as a product, and stores the calculated positions, thereby acquiring positional information of the inspected chip 101-1. Moreover, the second inspecting step ST6 inspects states of chips 101-1 in the groove 8 from the images 201-1 and 202-1 captured by the camera 63, and acquires positional information of chips 101-1 that are not allowable for the divided device 4 as a product based on the result of the inspection of the groove 8, as well as the positions in the X-axis and Y-axis directions of the groove 8 in the wafer 1, which represent positional information of the groove 8 in the wafer 1.

According to Embodiment 1, as the projected dicing lines 3 are difficult to see in the second inspecting step ST6 that detects chips 101 on the reverse side 9 of the wafer 1, the second inspecting step ST6 is arranged to detect chips 101 in excess of the range extending from the edges 8-1 of the groove 8 over the predetermined distance 120. Furthermore, according to the present invention, in the second inspecting step ST6, the projected dicing lines 3 on the face side 2 may be detected from the reverse side 9 by the camera 63 which is an infrared camera, and it may be inspected whether or not there is a portion 101-1 in excess of the range extending from the transverse center 3-1 of the projected dicing lines 3 over the predetermined distance 110. Thereafter, the wafer processing method according to Embodiment 1 goes to the second NG device determining step ST7.

(Second NG Device Determining Step)

The second NG device determining step ST7 is a step of determining NG device chips among a plurality of device chips 5 individually divided from the wafer 1 based on the inspection result of the second inspecting step ST6. According to Embodiment 1, an NG device chip refers to a device chip 5 that has a chip 101-1 that is not allowable for a product.

In the second NG device determining step ST7, according to Embodiment 1, the control unit 64 extracts a device chip 5 where a chip 101-1 that is not allowable for the device 4 as a product is present on an outer edge thereof, on the reverse side 9 of the wafer 1, based on the position of a chip 101-1 that is not allowable for the device 4 as a product on the reverse side 9 of the wafer 1 as represented by the inspection result of the second inspecting step ST6 on each wafer 1. In the second NG device determining step ST7, the control unit 64 determines a device chip 5 where a chip 101-1 that is not allowable for the device 4 as a product is present on an outer edge thereof as an NG device chip, calculates the position of the NG device chip, and stores the calculated position. In the second NG device determining step ST7, according to Embodiment 1, the control unit 64 stores the positions in the X-axis and Y-axis directions of the NG device chip on the wafer 1 in association with each wafer 1.

According to Embodiment 1, the grinding step ST5 and the second inspecting step ST6 are carried out on the wafer 1 using the grinding apparatus 30 illustrated in FIG. 10. When the grinding step ST5, the second inspecting step ST6, and the second NG device determining step ST7 have been carried out on all the wafers 1 from the cassette 36, the wafer processing method goes to the device sorting step ST8. According to the present invention, the wafer 1 may be ground to the finished thickness 6 using the grinding apparatus 30 illustrated in FIG. 10 or the like, and the second inspecting step ST6 and the second NG device determining step ST7 may be carried out on the wafer 1 where the grooves 8 are exposed on the reverse side 9, using another inspecting apparatus than the grinding apparatus 30.

(Device Sorting Step)

The device sorting step ST8 is a step of sorting NG device chips and normal device chips based on the result of the first NG device determining step ST3 and the result of the second NG device determining step ST7. According to Embodiment 1, an NG device chip refers to a device chip 5 that has a chip 100-1 or 101-1 that is not allowable for a product. In other words, a normal device chip 5 that is allowed for a product is free of chips 100 and 101 or has chips 100 and 101 formed within the range over the predetermined distances 110 and 120.

In the device sorting step ST8, the device sorting unit 22 illustrated in FIGS. 3 and 10 acquires the positions of NG device chips having a chip 100-1 based on the result of the first NG device determining step ST3 on each wafer 1 from the control unit 14 via the network 21. The device sorting unit 22 also acquires the positions of NG device chips having a chip 101-1 based on the result of the second NG device determining step ST7 on each wafer 1 from the control unit 64 via the network 21.

In the device sorting step ST8, the device sorting unit 22 identifies the positions of NG device chips where at least one of the chips 100-1 and 101-1 is positioned on outer edges thereof among a plurality of device chips 5 on each wafer 1 from the results acquired from the control units 14 and 64, and stores the identified positions. In the device sorting step ST8, according to Embodiment 1, the device sorting unit 22 peels off normal device chips 5, except the NG device chips on each wafer, from the protective member 23 with a pick-up mechanism, and does not peel off the NG device chips from the protective member 23. The wafer processing method is now ended. The NG device chips are subsequently discarded.

The device sorting unit 22 includes the pickup for peeling off device chips 5 from the protective member 23, and a computer having a processing device having a microprocessor such as a CPU, a storage device having a memory such as a ROM or a RAM, and an input/output interface device. The processing device of the computer of the device sorting unit 22 performs arithmetic and processing operations according to computer programs stored in the storage device and outputs control signals for controlling the pickup via the input/output interface device to the pickup.

The computer of the device sorting unit 22 is connected to a display unit, not depicted, such as a liquid crystal display unit displaying images and so on and an input unit that is used when the operator registers processing details information, etc. The input unit includes at least one of a touch panel on the display unit and an external input device such as a keyboard or the like. According to Embodiment 1, the computer of the device sorting unit 22 is connected to an external electronic device through the network 21.

There is known in the art a pre-dicing process (DBG: Dicing Before Grinding) as a processing method for minimizing chippings from dicing and increasing flexural strength when a wafer 1 with devices 4 formed on its face side 2 are divided into individual device chips 5. The wafer processing method according Embodiment 1 inspects states of grooves 8 after the grooves 8 have been formed in the face side 2 by the DBG process and also after the grooves 8 have been exposed on the reverse side 9 subsequently to the grinding step ST5. Therefore, the wafer processing method is able to inspect states of chips 101 on the reverse side 9 of the divided device chips 5 in addition to states of chips 100 on the face side 2 thereof.

The wafer processing method is capable of capture images of the face side 2 and the reverse side 9 where chips 100 and 101 on device chips 5 are exposed without resticking tapes for inspection in order to inspect states of grooves 8 after the grooves 8 have been formed in the face side 2 in the DBG process and after the grooves 8 have been exposed on the reverse side 9.

Furthermore, as the positions of chips 100 and 101 are detected in the inspecting steps ST2 and ST6, the wafer processing method can discard NG device chips with chips 100-1 and 100-1 that are not allowable for a product, use proper device chips 5 as products, and prevent device chips 5 from being lowered in quality.

Since the grinding apparatus 30 according to Embodiment 1 includes the inspecting unit 43 inspecting the reverse side 9 of the wafer 1 that has been ground, the grinding apparatus 30 can inspect states of chips 101 on the reverse side 9 of the wafer 1.

Embodiment 2

Figure 16:
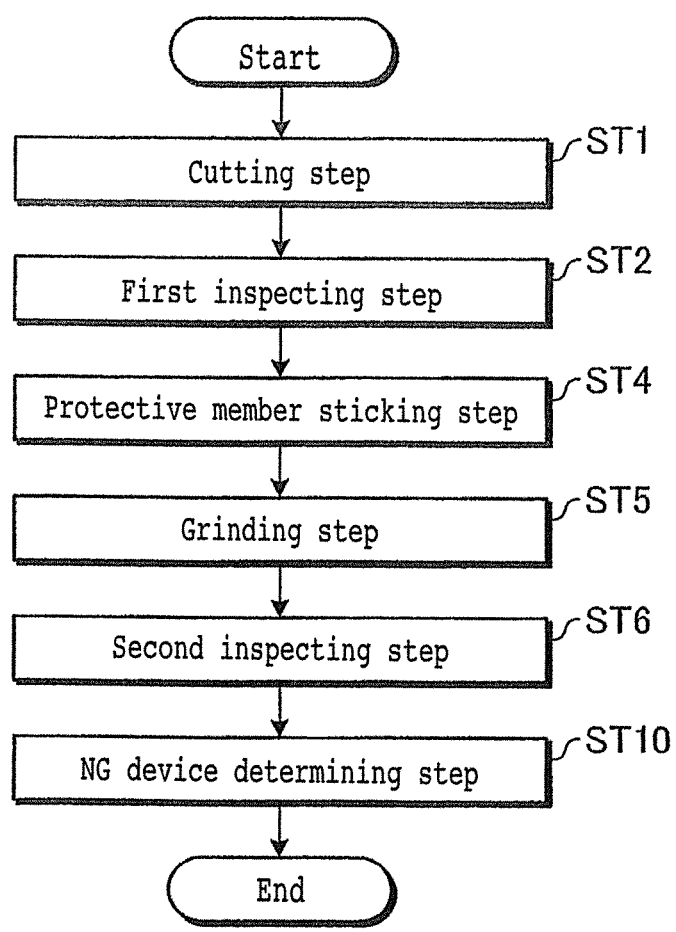
FIG. 16 is a flow chart of a method of processing a wafer according to Embodiment 2.

A method of processing a wafer according to Embodiment 2 of the present invention will be described below with reference to the drawings. FIG. 16 is a flowchart of the method of processing a wafer, also referred to as "wafer processing method," according to Embodiment 2. In FIG. 16, those parts of Embodiment 2 that are identical to those of Embodiment 1 are denoted by identical reference symbols and will not be described in detail.

As illustrated in FIG. 16, the wafer processing method according to Embodiment 2 includes the cutting step ST1, the first inspecting step ST2, the protecting member sticking step ST4, the grinding step ST5, and the second inspecting step ST6, is devoid of the first NG device determining step ST3, the second NG device determining step ST7, and the device sorting step ST8, and includes an NG device determining step ST10.

In the first inspecting step ST2 of the wafer processing method according to Embodiment 2, the control unit 14 stores the positions in the X-axis and Y-axis directions of chips 100-1 on the face side 2 of the wafer 1 in association with each wafer 1, in addition to performing various processes according to Embodiment 1. In the second inspecting step ST6 of the wafer processing method according to Embodiment 2, the control unit 64 stores the positions in the X-axis and Y-axis directions of chips 101-1 on the reverse side 9 of the wafer 1 in association with each wafer 1, in addition to performing various processes according to Embodiment 1.

The NG device determining step ST10 of the wafer processing method according to Embodiment 2 is a step of determining NG device chips among a plurality of device chips 5 individually divided from the wafer 1 based on the inspection result of the first inspecting step ST2 and the inspection result of the second inspecting step ST6, and sorting NG device chips and proper device chips 5.

In the NG device determining step ST10, the device sorting unit 22 acquires the positions of chips 100-1 on the face side 2 of the wafer 1 based on the inspection result of the first inspecting step ST2 on each wafer 1 from the control unit 14 via the network 21. The device sorting unit 22 also acquires the positions of chips 101-1 on the reverse side 9 of the wafer 1 based on the inspection result of the second inspecting step ST6 on each wafer 1 from the control unit 64 via the network 21.

In the NG device determining step ST10, the device sorting unit 22 identifies the positions of NG device chips where at least one of the chips 100-1 and 101-1 is positioned on outer edges thereof among a plurality of device chips 5 of each wafer 1 from the positions of chips 100-1 and 101-1 acquired from the control units 14 and 64, and stores the identified positions. In the NG device determining step ST10, according to Embodiment 2, the device sorting unit 22 peels off normal device chips 5, except the NG device chips on each wafer 1, from the protective member 23 with a pick-up mechanism, and does not peel off the NG device chips from the protective member 23. The wafer processing method is now ended. The NG device chips are subsequently discarded.

The wafer processing method according to Embodiment 2 inspects states of grooves 8 after the grooves 8 have been formed in the face side 2 by the DBG process and also after the grooves 8 have been exposed on the reverse side 9 subsequently to the grinding step ST5. Therefore, as with Embodiment 1, the wafer processing method is able to inspect states of chips 101 on the reverse side 9 of the divided device chips 5 in addition to states of chips 100 on the face side 2 thereof.

The present invention is not limited to the above embodiments. In other words, various changes and modifications may be made in the embodiments without departing from the scope of the invention. In Embodiment 1, the projected dicing lines 3 are inspected in their entirety in the inspecting steps ST2 and ST6. According to the present invention, predetermined positions on the projected dicing lines 3 may be inspected in the inspecting steps ST2 and ST6.

In Embodiment 1, those device chips 5 which have chips 100-1 and 101-1 that are not allowable for the divided device 4 as a product on at least one of the face side 2 and the reverse side 9 are handled as NG device chips. According to the present invention, however, those device chips 5 that lie in predetermined ranges determined from chips 100-1 and 101-1 that are not allowable for the divided device 4 as a product on at least one of the face side 2 and the reverse side 9 may be handled as NG device chips.

According to the present invention, the first inspecting step ST2 may be carried out by a protective member sticking apparatus that performs the protecting member sticking step ST4, and the protective member sticking apparatus may include an inspecting unit capturing an image of the face side 2 of the wafer 1, detecting chips 100 and 100-1, and carrying out the first inspecting step ST2.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer having a plurality of projected dicing lines on a face side thereof and a plurality of devices formed in respective areas of the face side that are demarcated by the projected dicing lines, comprising:
    a cutting step of cutting the face side of the wafer with a cutting blade to form grooves therein along the projected dicing lines to a depth in excess of a finished thickness of the wafer;
    a first inspecting step of capturing an image of the grooves formed in the cutting step from the face side of the wafer using an image capturing unit and inspecting a state of a chip in the captured image of the grooves using a control unit;
    after the first inspecting step, a protecting member sticking step of sticking a protective member to the face side of the wafer;
    a grinding step of holding the protective member side of the wafer on a chuck table and grinding a reverse side of the wafer to thin the wafer to a finished thickness, thereby dividing the wafer into device chips; and
    after the grinding step, a second inspecting step of capturing an image of the grooves exposed on the reverse side of the wafer from the reverse side of the wafer using a camera and inspecting a state of a chip in the captured image of the grooves using the control unit.

2. The method of processing a wafer according to claim 1, wherein each of the first inspecting step and the second inspecting step includes the steps of acquiring positional information of the grooves in the wafer whose image has been captured using the control unit and acquiring positional information of the inspected chip using the control unit.

3. A grinding apparatus comprising:
    a chuck table for holding a wafer having grooves cut therein on a holding surface thereof;
    a grinding unit grinding the wafer held on the chuck table with grinding stones mounted on a spindle having a rotational axis perpendicular to the holding surface of the chuck table; and
    an inspecting unit having a camera for capturing an image of the grooves which are exposed on a reverse side of the wafer when the wafer held on the chuck table is ground by the grinding unit, wherein the inspecting unit inspects a state of a chip in the grooves from the image captured by the camera and acquires the result of inspection of the grooves together with positional information of the grooves in the wafer.

4. The method of claim 1 wherein the wafer has a plurality of devices formed on a face side of the wafer; and
    wherein when the grooves are cut along the projected dicing lines, at least one chip is formed in an edge portion of at least one of the grooves.

5. The method of claim 4 wherein at least one of the first inspecting step or second inspecting step comprises the control unit receiving the image of the grooves and determining if the chip extends beyond a predetermined distance from a center of an associated dicing line.

6. The method of claim 5 further comprising the control unit categorizing an individual device chip as a NG (No Good) device chip if the device chip has an edge having a chip therein that has been determined to extend beyond the predetermined distance from a center of an associated dicing line.

7. The method of claim 6 wherein both the first inspecting step and second inspecting step comprise the control unit receiving the image of the grooves and determining if the chip extends beyond a predetermined distance from a center of an associated dicing line.

8. The grinding apparatus of claim 3 wherein the wafer has a plurality of devices formed on a face side of the wafer and having grooves cut therein along projected dicing lines on a face side of the wafer, wherein the grooves are cut to a depth in excess of a finished thickness of the wafer; and wherein when the grinding unit grinds the wafer to a finished thickness, the wafer is divided into individual device chips, and wherein when the grooves are cut along the projected dicing lines, at least one chip is formed in an edge portion of at least one of the grooves.

9. The grinding apparatus of claim 8, wherein inspecting unit further comprises a control unit that receives the image of the grooves captured by the camera and determines if the chip extends beyond a predetermined distance from a center of an associated dicing line.

10. The grinding apparatus of claim 9, wherein inspecting unit categorizes an individual device chip as a NG (No Good) device chip if the device chip has an edge having a chip therein that has been determined to extend beyond the predetermined distance from a center of an associated dicing line.

* * * * *